United States Patent
Ho

(12) 
(10) Patent No.: US 11,575,379 B2
(45) Date of Patent: Feb. 7, 2023

(54) SWITCH WITH HYSTERESIS

(71) Applicant: Delphi Technologies IP Limited, Saint Michael (BB)

(72) Inventor: Kian Mun Ho, Sengkang (SG)

(73) Assignee: DELPHI TECHNOLOGIES IP LIMITED, St. Michael (BB)

( * ) Notice: Subject to any disclaimer, the term of this patent is extended or adjusted under 35 U.S.C. 154(b) by 0 days.

(21) Appl. No.: 17/648,492

(22) Filed: Jan. 20, 2022

(65) Prior Publication Data

US 2022/0311438 A1      Sep. 29, 2022

(30) Foreign Application Priority Data

Mar. 23, 2021   (SG) .......................... 10202102992W

(51) Int. Cl.
*H03K 17/60* (2006.01)
*H03K 17/693* (2006.01)
(Continued)

(52) U.S. Cl.
CPC ......... *H03K 17/693* (2013.01); *H01L 27/082* (2013.01); *H02M 3/158* (2013.01); *H03K 19/00376* (2013.01)

(58) Field of Classification Search
CPC ....... H03K 17/04113; H03K 17/04123; H03K 17/04166; H03K 17/04213; H03K 17/08112; H03K 17/08126; H03K 17/08146; H03K 17/0826; H03K 17/60; H03K 17/602; H03K 17/62; H03K 17/692;
(Continued)

(56) References Cited

U.S. PATENT DOCUMENTS

| 4,719,367 A | 1/1988 | Denda |
| 5,287,014 A | 2/1994 | Kinoshita |

(Continued)

FOREIGN PATENT DOCUMENTS

| DE | 102018217496 A1 | 8/2019 |
| GB | 2221088 A | 1/1990 |
| KR | 10-2011-0109400 A | 10/2011 |

*Primary Examiner* — Long Nguyen
(74) *Attorney, Agent, or Firm* — Joshua M. Haines; Bookoff McAndrews, PLLC

(57) ABSTRACT

Switch circuitry including an input terminal (1), said input terminal connected to the base of a first transistor (Q1) via a first resistor (R3), said first transistor being an NPN Bipolar Gate Transistor (Q1), said circuitry further comprising a second resistor (R5) connected between the base of said first transistor (Q1) and ground, and including an output line or terminal (3) connected to the collector of said first transistor (Q1), and wherein the emitter of said first transistor (Q1) is connected to ground (earth), said circuitry further including a second transistor (Q2), said second transistor being a PNP Bipolar Gate Transistor, wherein the collector of said second transistor (Q2) is connected via a third resistor (R8) to the base of said first transistor (Q1), and the emitter of said second transistor (Q2) is connected to said input terminal (1), and wherein the emitter of said second transistor (Q2) is additionally connected to the base of said second transistor (Q2) via a fourth resistor (R11); and the base of said second transistor (Q2) being additionally connected to the output terminal (3) via a fifth resistor (R10) and a diode (D1).

2 Claims, 2 Drawing Sheets

(51) Int. Cl.
*H01L 27/082* (2006.01)
*H02M 3/158* (2006.01)
*H03K 19/003* (2006.01)

(58) Field of Classification Search
CPC ...... H03K 17/74; H03K 17/76; H03K 19/001; H03K 19/00307; H03K 19/00353; H03K 19/00376; H03K 19/013; H02J 1/102; H02J 13/00036; H02M 3/158; H01L 27/082
See application file for complete search history.

(56) References Cited

U.S. PATENT DOCUMENTS

| | | | |
|---|---|---|---|
| 6,650,137 B2 * | 11/2003 | Philippart | H03F 3/183 327/478 |
| 2003/0193339 A1 | 10/2003 | Philippart et al. | |
| 2022/0029615 A1 * | 1/2022 | Lyu | H03K 17/60 |

* cited by examiner

SWITCH WITH HYSTERESIS

CROSS-REFERENCE TO RELATED APPLICATION(S)

This patent application claims the benefit of priority to Singapore Application No. 10202102992 W, filed on Mar. 23, 2021, the entirety of which is incorporated herein by reference.

TECHNICAL FIELD

This relates to solid state switches and switch circuits and simple switches/switch circuits which include Bipolar Junction Transistors (BJTs).

BACKGROUND OF THE INVENTION

A single BJT switch has no hysteresis. An unstable input voltage (e.g. with noise) at or close to the threshold level to the base may cause the switch to turn on and off repeatedly.

More complex designs available with multiple BJTs (three or more BJT's) or with comparator solution are used to overcome this problem and to create hysteresis.

It is an object of the invention to overcome this problem and to create a simpler and cheaper switch circuit which includes hysteresis.

The problem of a single BJT NPN open collector switch without hysteresis is vulnerable to unstable input voltage at threshold level to the base of the BJT is solved by adding another BJT (PNP) switch to enhance the turn on current to the base of the NPN.

SUMMARY OF THE INVENTION

In one aspect is provided Switch circuitry comprising an input terminal, said input terminal connected to the base of a first transistor (Q1) via a first resistor R3, said first transistor being an NPN Bipolar Gate Transistor (Q1), further comprising a second resistor (R5) connected between the base of said first transistor Q1 and ground, and including an output line or terminal connected to the collector of said first transistor (Q1), and wherein the emitter of said first transistor (Q1) is connected to ground (earth), said circuitry further including a second transistor (Q2), said second transistor being a PNP Bipolar Gate Transistor, wherein the collector of said second transistor (Q2) is connected via a third resistor (R8) to the base of said first transistor (Q1), and the emitter of said second transistor Q2 is connected to said input terminal, and wherein the emitter of said second transistor (Q2) is additionally connected to the base of said second transistor Q2 via a fourth resistor R11; and the base of said second transistor (Q2) being additionally connected to the output terminal (3) via a fifth resistor (R10) and a diode (D1.

Said diode D1 may be electrically connected between said fourth resistor (R10) and output line/terminal (3).

BRIEF DESCRIPTION OF THE DRAWINGS

The present invention is now described by way of example with reference to the accompanying drawings in which.

DESCRIPTION OF THE PREFERRED EMBODIMENTS

Figure 1:
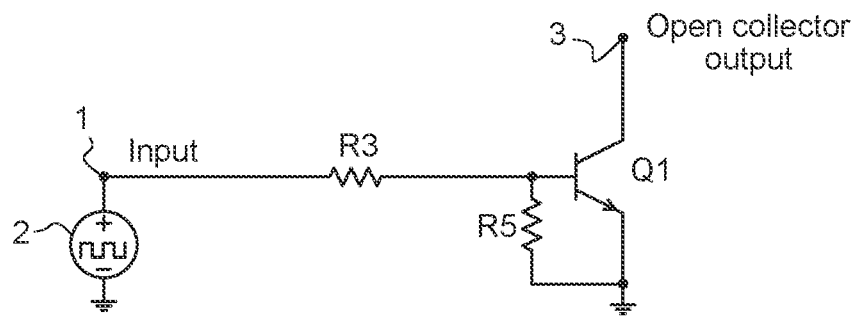
FIG. 1 shows a known simple switch arrangement.

FIG. 1 shows a known simple switch arrangement with input line 1 or terminal (e.g. from a switching source 2) connected via resistor R3 to the base of BJT (NPN) designated Q1. There is included resistor R5 between the base and ground. The output line/terminal 3 is shown, effectively connected to the collector of Q1. Thus, this describes a conventional open collector NPN BJT switch with BJT Q1. R3 is used to limit the current to base and R5 to ensure Q1 is off when there is no voltage at the input.

As mentioned, this circuit has no hysteresis so in a typical open collector NPN switch below there is no Schmitt trigger or hysteresis. Noise on the input can toggle the switch on and off means it can be unstable.

Figure 2:
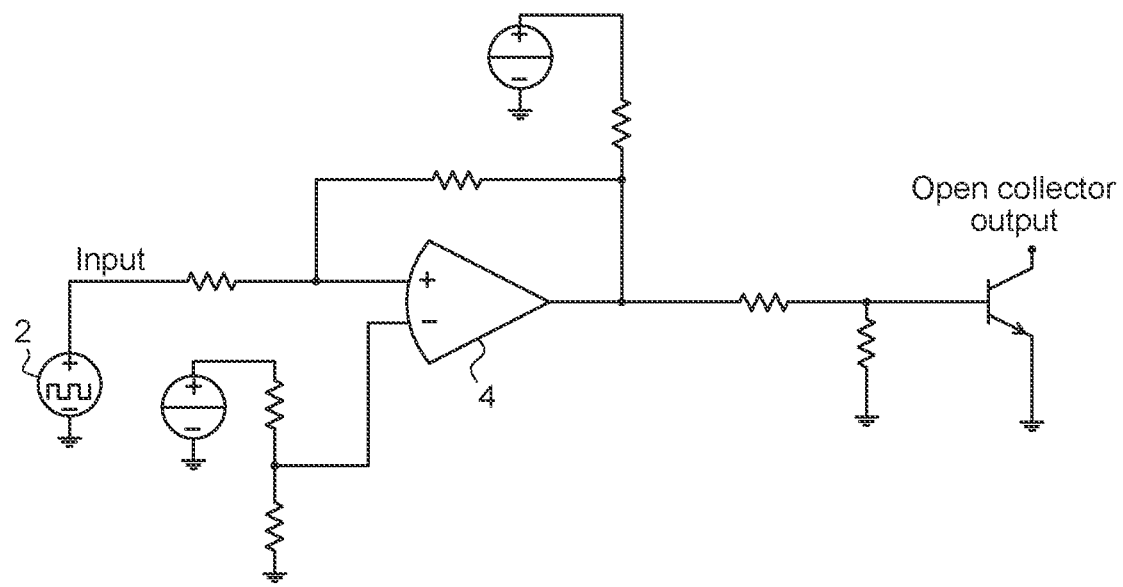
FIG. 2 shows a known switch arrangement with a comparator.

A known solution is to use add a comparator for to add hysteresis. FIG. 2 shows such an arrangement. In addition, the comparator 4 needs another power supply as the comparator needs regulated voltage. These additional requirements/components mean the circuitry is more complicated and expensive.

Invention

Figure 3:
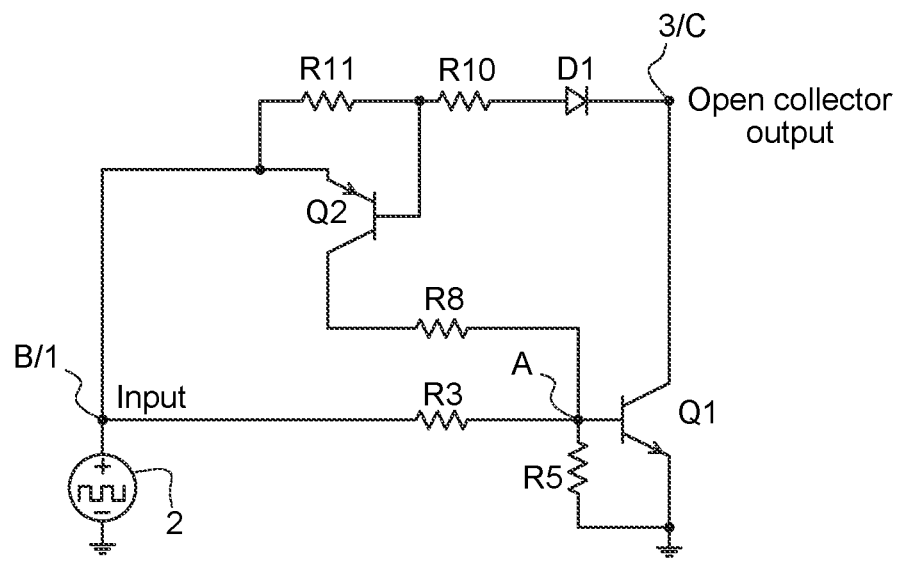
FIG. 3 shows an example of the invention.

In one example, the circuitry provides a switch with hysteresis which is efficient and reliable. FIG. 3 shows an example. As with FIG. 1 there is an input line or terminal 1 (e.g. electrically connected or connectable to a switching source 2) which is connected via resistor R3 to the base of a BJT (NPN) designated Q1. There is included in the circuitry resistor R5, connected between the base of Q1 and ground. The output line or terminal 3 is shown, effectively connected to the collector of Q1, and can be considered an open collector output. The emitter of Q1 is directly connected to ground (earth).

In addition, the circuit includes a further BJT designated Q2 which is a PNP transistor. The collector of Q2 is connected via a resistor R8 to the base of Q1, and the emitter of Q2 is connected to the input line/terminal 1. The emitter of Q2 is also connected to the base of Q2 via resistor R11; the base of Q2 also being connected to the output terminal via a resistor R10 and a diode D1; diode D1 being located between resistor R10 and output line/terminal 3. Optionally the positions of the resistor R10 and diode may be interchanged ie. The resistor R10 may be located (i.e. electrically connected between the diode and terminal 3.

So, the circuitry effectively provides a Schmitt trigger switch by adding a second BJT Q2 which is a PNP BJT, as well as resistors R8, R11, R10 and a diode.

Operation

Input voltage rises to threshold voltage just enough to turn on Q1 through R3. When Q1 turns on, it will also turn on Q2 through R10 and diode. When Q2 turns on, more current is provided to the base of Q1 through R8. This forces the Q1 to "turn on" state. This enhances the turn on current to base of Q1.

Operation

Figure 4:
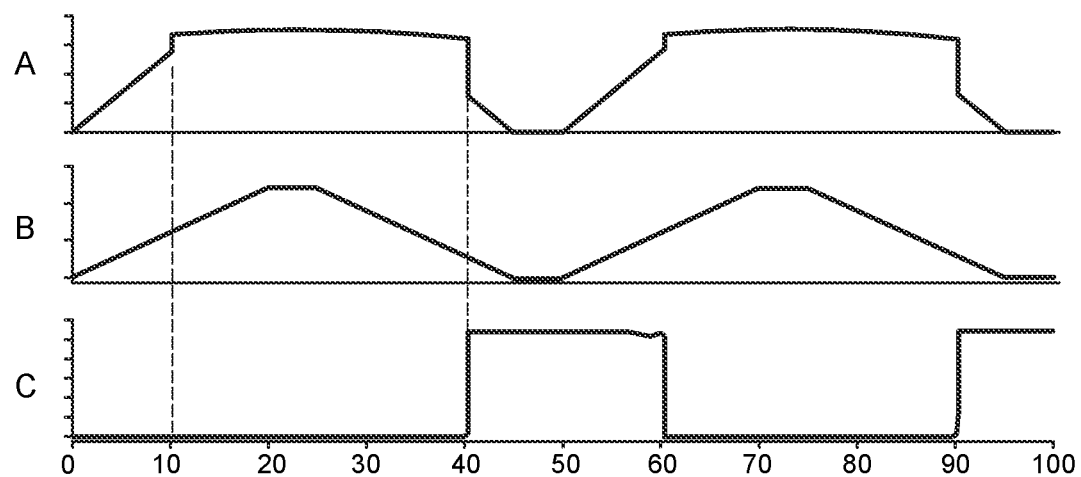
FIG. 4 shows operation of the circuitry of FIG. 3.

FIG. 4 shows an example of operation of the circuitry of FIG. 3. The set-up is as follows; i) Input toggling on/off with a slow ramp up and down ii) a DC voltage source though a resistor is connected to the Open Collector Output 3. Plots A, B, C show the voltage at points A, B, C respectively in FIG. 3.

As Q1 NPN turns on (output voltage go to zero), the Q1 NPN base voltage shoots up from 0.5V to 0.7V. This is a result of Q2 providing more current to the base. In this example, the turn on voltage (low to high) is 6.2V and the turn off voltage (high to low) is 2.8V. Threshold voltage and hysteresis range can be adjusted by adjusting the resistance values (of which resistors).

The invention claimed is:

1. Switch circuitry comprising an input terminal (1), said input terminal connected to the base of a first transistor (Q1) via a first resistor (R3), said first transistor being an NPN Bipolar Gate Transistor (Q1), said circuitry further comprising a second resistor (R5) connected between the base of said first transistor (Q1) and ground, and including an output line or terminal (3) connected to the collector of said first transistor (Q1), and wherein the emitter of said first transistor (Q1) is connected to said ground (earth), said circuitry further including a second transistor (Q2), said second transistor being a PNP Bipolar Gate Transistor, wherein the collector of said second transistor (Q2) is connected via a third resistor (R8) to the base of said first transistor (Q1), and the emitter of said second transistor (Q2) is connected to said input terminal (1), and wherein the emitter of said second transistor (Q2) is additionally connected to the base of said second transistor (Q2) via a fourth resistor (R11); and the base of said second transistor (Q2) being additionally connected to the output terminal (3) via a fifth resistor (R10) and a diode (D1).

2. Circuitry as claimed in claim 1, wherein said diode (D1) is electrically connected between said fourth resistor (R10) and said output line or terminal (3).

* * * * *